(12) United States Patent
Chiu

(10) Patent No.: US 12,308,224 B2
(45) Date of Patent: May 20, 2025

(54) SILICON CARBIDE WAFERS AND GRINDING METHOD THEREOF

(71) Applicant: GlobalWafers Co., Ltd., Hsinchu (TW)

(72) Inventor: Chin Chen Chiu, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 400 days.

(21) Appl. No.: 17/736,110

(22) Filed: May 4, 2022

(65) Prior Publication Data

US 2022/0392761 A1 Dec. 8, 2022

(30) Foreign Application Priority Data

Jun. 8, 2021 (TW) ................................. 110120789

(51) Int. Cl.
*H01L 21/02* (2006.01)
*C30B 29/36* (2006.01)
*H01L 29/16* (2006.01)

(52) U.S. Cl.
CPC ........ *H01L 21/02013* (2013.01); *C30B 29/36* (2013.01); *H01L 21/02378* (2013.01); *H01L 29/1608* (2013.01)

(58) Field of Classification Search
CPC . B24B 7/228; B24B 41/068; H01L 21/02013; H01L 29/1608; H01L 21/02378; H01L 33/0075; H01L 21/02389; C30B 29/36; C30B 33/00; C30B 29/403; C30B 23/066; C30B 23/002; C30B 23/06;
(Continued)

(56) References Cited

U.S. PATENT DOCUMENTS 10,611,052 B1 4/2020 Bubel et al.
2005/0064802 A1 3/2005 Wiswesser et al.
(Continued)

FOREIGN PATENT DOCUMENTS

CN 1402312 3/2003
CN 1612290 5/2005
(Continued)

OTHER PUBLICATIONS

"Office Action of China Counterpart Application", issued on Aug. 23, 2024, p. 1-p. 8.
(Continued)

*Primary Examiner* — Mouloucoulaye Inoussa
(74) *Attorney, Agent, or Firm* — JCIPRNET

(57) ABSTRACT

A method for grinding a silicon carbide wafer includes the following steps. Firstly, a single crystal is sliced into several wafers, in which each wafer has a silicon-side surface, which is the first surface. The opposite side is a carbon-side surface, which is the second surface. Subsequently, the silicon-side of the wafer is faced down and placed on a grinding stage for performing a first grinding process. It should be noted that a supporting structure exist between the wafer and the grinding stage. The supporting structure can have a concave or a convex framework. After grinding the carbon-side and removing the wafer from the stage, the wafer will appear convex or concave shape on the carbon-side surface. Thereafter, the wafer is flipped upside down and the carbon-side is placed on a flat stage without any supporting structure. Finally, the silicon-side is ground as a second grinding process.

12 Claims, 12 Drawing Sheets

(58) Field of Classification Search
CPC ..... C23C 16/0254; C23C 16/56; C23C 16/01; C23C 16/274; C23C 16/27; C01B 21/072; H01S 5/3013; H01S 5/34333; H01S 5/0217

See application file for complete search history.

(56) References Cited

U.S. PATENT DOCUMENTS

| | | | | |
|---|---|---|---|---|
| 2011/0021006 | A1* | 1/2011 | Moslehi | H01L 21/67092 438/479 |
| 2015/0275393 | A1* | 10/2015 | Bondokov | C30B 29/403 117/88 |
| 2016/0151887 | A1* | 6/2016 | Christen | B24B 55/102 51/296 |
| 2017/0327970 | A1* | 11/2017 | Muto | C23C 16/4585 |
| 2018/0282902 | A1* | 10/2018 | Nakabayashi | C30B 29/36 |
| 2020/0071818 | A1* | 3/2020 | Xu | C23C 16/274 |
| 2021/0010158 | A1* | 1/2021 | Sakai | H01L 21/0262 |
| 2021/0010161 | A1* | 1/2021 | Ikeda | C30B 23/066 |
| 2021/0047750 | A1* | 2/2021 | Kido | C30B 23/025 |
| 2021/0115592 | A1* | 4/2021 | Park | C01B 32/956 |
| 2021/0299527 | A1* | 9/2021 | Schweigert | A63B 53/10 |
| 2021/0328024 | A1* | 10/2021 | Enokizono | C30B 29/36 |
| 2022/0056612 | A1* | 2/2022 | Wang | C30B 29/36 |
| 2022/0064817 | A1* | 3/2022 | Park | C30B 23/06 |
| 2022/0072678 | A1* | 3/2022 | Joeng | B24B 37/26 |
| 2022/0223759 | A1* | 7/2022 | Chen | H01L 33/04 |
| 2022/0282397 | A1* | 9/2022 | Leroux | C30B 25/02 |
| 2023/0203708 | A1* | 6/2023 | Park | C30B 29/36 117/84 |
| 2023/0282472 | A1* | 9/2023 | Yu | H01L 21/02035 438/691 |
| 2023/0292287 | A1* | 9/2023 | Ceendhralu | H04W 68/02 |
| 2023/0392293 | A1* | 12/2023 | Shonai | C30B 23/02 |
| 2024/0003054 | A1* | 1/2024 | Ecker | C30B 23/002 |

FOREIGN PATENT DOCUMENTS

| | | |
|---|---|---|
| CN | 102049723 | 5/2011 |
| CN | 103107136 | 5/2013 |
| CN | 102257190 | 4/2014 |
| CN | 103903975 | 7/2014 |
| CN | 104508798 | 4/2015 |
| CN | 105648524 | 3/2018 |
| CN | 110465846 | 11/2019 |
| CN | 112695384 | 4/2021 |
| CN | 213034234 | 4/2021 |
| JP | H03213263 | 9/1991 |
| JP | 2000108002 | 4/2000 |
| JP | 2009028889 | 2/2009 |
| JP | 2012121120 | 6/2012 |
| TW | 448085 | 8/2001 |
| WO | 0195387 | 12/2001 |

OTHER PUBLICATIONS

Chu; Junhao et al., "Semiconductor Material Technology", Zhejiang Science and Technology Publishing House, Feb. 2010, with English translation thereof, pp. 1-14.

Liang; Jin et al., "Experimental Study on Grinding Process of Silicon Carbide Wafer", Equipment for Electronic Products Manufacturing, Feb. 20, 2018, with English abstract, pp. 1-5, vol. 268.

Chen; Kuo Mei, "Study on the Ultra-Precison Polishing Technology and Mechanism of Silicon Carbide Substrates," Master's thesis, Jun. 2017, Light Industry Machinery and Packaging Engineering, Jiangnan University.

"Notice of allowance of Taiwan Counterpart Application", issued on Feb. 19, 2025, p. 1-p. 5.

* cited by examiner flipped upside down

Attached grinding stripped and removed

SILICON CARBIDE WAFERS AND GRINDING METHOD THEREOF

CROSS-REFERENCE TO RELATED APPLICATION

This application claims the priority benefit of Taiwan application serial no. 110120789, filed on Jun. 8, 2021. The entirety of the above-mentioned patent application is hereby incorporated by reference herein and made a part of this specification.

BACKGROUND

Technical Field

The present invention relates to a silicon carbide wafer, and more particularly, to a silicon carbide wafer and a grinding method thereof. By utilizing a predetermined external bending deformation of the wafer for buffering or offsetting the influence of internal residual stress of the wafer on the curvature of the wafer, it is possible to improve its geometric curvature.

Description of Related Art

Silicon carbide ingots are generally formed by a physical vapor transport method, whereby induction heating is performed in a high temperature furnace of about 2450° C. to volatilize the silicon carbide solid raw material, which is deposited on the surface of the seed crystal for growing and thickening to form the ingot. As shown in FIG. 1, in the traditional crystal growth process, the seed crystals 106 is placed on the ceiling end of the high temperature furnace 102, and the silicon carbide powder 110 is used as a solid evaporation source, and is placed at the base end of the high temperature furnace 102, and whereby the high temperature furnace 102 is heated with the induction coil 104. During the growth process, the seed crystals 106 receive the re-solidified raw material (silicon carbide powder 110) transformed from the gaseous state, and slowly form a semiconductor material on the surface of the seed crystals 106 until an ingot 108 with a desired size is obtained. The ingot 108 may consist of different crystalline structures depending on the fabrication method, the raw material, and the seed crystal orientation. For example, the ingot 108 includes 3C-silicon carbide, 4H-silicon carbide, 6H-silicon carbide, and the like. 3C-silicon carbide belongs to the cubic crystal system, while 4H-silicon carbide and 6H-silicon carbide belong to the hexagonal crystal system.

In the crystal growth process, the ingot 108 is grown in a high temperature environment of 2300° C. to 2500° C. The end surface of the growing ingot 108 close to the seed crystal 106 is called the seed end 108B, while the end surface of the crystal ingot 108 facing away from the seed crystal 106 is called the dome end 108A. The temperature difference between the seed end 108B and the dome end 108A may be tens to hundreds of degrees Celsius due to different temperature distributions in the furnace. In such a case, after crystal growth of the ingot 108 is completed, and after lowering to ambient temperature, the inside of the ingot 108 may develop residual stress. Taking silicon carbide as an example, the seed end 108B is a silicon-side surface, and the dome end 108A is a carbon-side surface. The silicon-side surface may develop residual compressive stress and the carbon-side surface may develop residual tensile stress.

More specifically, after the growth of the ingot 108 is completed, the ingot 108 is cooled to room temperature by furnace cooling or by other methods. When the ingot 108 is cooled to below the plastic-elastic transition temperature region, the shrinkage deformation caused by the continuous cooling of the ingot 108 gradually cannot be slipped, formed, combined, or plastically deformed by immediate dislocation for strain relaxation or transient thermal stress re-distribution. Gradually, the shrinkage deformation accumulated at different time points and at different positions will result in residual stress. When considering the pure elastic material properties of the ingot 108, the thermal shrinkage of the ingot is roughly in line with the following formula:

$$\varepsilon = k\Delta T$$

In the above formula, $\varepsilon$ is the strain, k is the thermal expansion coefficient, and $\Delta T$ is the temperature difference. After the growth of the ingot 108 is completed, the cooling will pass through the plastic-elastic transition temperature region, and when the ingot 108 is cooled again, the ingot 108 can simply be regarded as an elastic material, and the seed end 108B and the dome end 108A begin to cool down from different temperatures. For example, the seed end 108B may be cooled from 1800° C. to 20° C., and the dome end 108A may be cooled from 1900° C. to 20° C. In this case, the temperature difference of the dome end 108A is large, and a larger shrinkage will occur. Therefore, its shrinkage will be restrained and hindered by the seed end 108B, thereby generating tensile stress at the dome end. In contrast, the seed end 108B will develop compressive stress.

FIG. 2A and FIG. 2B are schematic cross-sectional views illustrating an ingot obtained after a crystal growth process and a slicing process of the ingot according to some embodiments of the present disclosure. As shown in FIG. 2A, the seed end 108B of the ingot 108 obtained through the crystal growth process exhibits residual compressive stress, and the dome end 108A of the ingot 108 exhibits residual tensile stress. As shown in FIG. 2B, the obtained ingot 108 is sliced to obtain a plurality of wafers. For example, the corners of the ingot 108 are cut into equal-diameter cylinders along the first direction D1 and ground into rounded corners to prevent the corners of the wafer from being damaged due to collision. Subsequently, the ingot 108 is sliced along the second direction D2 to separate the plurality of wafers. The slicing method of the ingot 108 includes slicing with a knife or a steel wire in combination with abrasive grains (abrasive grains such as diamond particles). In some cases, compressive stress and tensile stress remain inside of the sliced wafer in a similar way as with the ingot 108.

FIG. 3A is a schematic cross-sectional view of the wafer 108W obtained after slicing through the above process. As shown in FIG. 3A, in the wafer 108W formed by the conventional process, the residual stress causes bending of the basal plane BP (or C-plane), which is where the atoms in the crystal are arranged. The degree of bending of the basal plane BP can be determined by X-ray diffraction according to the angle shift dθ of a specific diffraction angle 2θ. For wafers with the same thickness h, the smaller the bending radius of curvature y, the larger the residual stress, whereby stress=$\{E \cdot (h/2)\}/\{y \cdot (1-\upsilon)\}$; E represents the Young's modulus of the wafer, and $\upsilon$ is the Poussin coefficient.

In addition, as shown in FIG. 3B, after the grinding and polishing processes are performed on the wafer 108W, the thickness h of the wafer 108W is reduced (for example, reduced by hundreds of microns), and the rigidity of the wafer (rigidity: $D=E \cdot h^3/\{12 \cdot (1-\upsilon^2)\}$) becomes smaller. The residual stress inside the wafer 108W will be partially released due to the reduced rigidity of the wafer, and due to stress re-distribution, the basal plane BP will tend to develop into a flat manner, resulting in geometric curvature causing a bow appearance or warp appearance of the wafer 108W.

Accordingly, after the ingot is sliced and ground, how to keep the silicon carbide wafers with ideal appearance and flatness is an important issue in the physical vapor transport fabrication process of semiconductor materials.

SUMMARY

The present disclosure provides a grinding method of silicon carbide wafers, which utilizes a predetermined external bending deformation of the wafer for buffering or offsetting the influence of internal residual stress of the wafer on the curvature of the wafer, thereby achieving a flat appearance of the silicon carbide wafer.

A grinding method of silicon carbide wafers according to some embodiments of the present disclosure is provided, and the method includes the following steps. Slicing an ingot obtained from a crystal growth process to obtain a silicon carbide wafer, wherein the silicon carbide wafer has a first surface and a second surface opposite to the first surface. Placing the silicon carbide wafer on a grinding stage for performing a grinding process, wherein a supporting structure having a concave surface or a convex surface is interposed between the grinding stage and the silicon carbide wafer. The grinding process includes the following steps. Placing the silicon carbide wafer on the concave surface or the convex surface of the supporting structure, so that the first surface contacts the concave surface or the convex surface, and performing grinding to remove portions of the second surface of the silicon carbide wafer. Removing the supporting structure, flipping the silicon carbide wafer and placing the silicon carbide wafer on a perfectly flat grinding stage without any supporting structure thereon, and performing another grinding to remove portions of the first surface of the silicon carbide wafer In some embodiments, the concave surface of the supporting structure has a concave depth of 20 μm to 60 μm, or the convex surface of the supporting structure has a convex height of 20 μm to 60 μm.

In some embodiments, when the first surface has residual compressive stress and the second surface has residual tensile stress, a supporting structure with a convex surface should be used, and when the first surface has residual tensile stress and the second surface has residual compressive stress, a supporting structure with a concave surface should be used.

In some embodiments, after the supporting structure is removed, the silicon carbide wafer is flipped and placed onto a flat surface of the grinding stage, so that the second surface is in contact with the flat surface, and the grinding is performed to remove portions of the first surface of the silicon carbide wafer.

In some embodiments, after grinding is performed once on both sides of the wafer, the first surface will develop a negative curvature when the supporting structure has a concave surface, and the first surface will develop a positive curvature when the supporting structure has a convex surface.

In some embodiments, the supporting structure is an adhesive tape including the convex surface, and the adhesive tape includes a first adhesive layer, a second adhesive layer, and a third adhesive layer. The first adhesive layer has a first diameter DA1. The second adhesive layer is located on the first adhesive layer and has a second diameter DA2. The third adhesive layer is located on the second adhesive layer and has a third diameter DA3, wherein DA1>DA2>DA3.

In some embodiments, the supporting structure is an adhesive tape including the concave surface, and the adhesive tape includes a first adhesive layer, a second adhesive layer, and a third adhesive layer. The second adhesive layer is located on the first adhesive layer, wherein the second adhesive layer has a first opening that expose a portion of the first adhesive layer. The third adhesive layer is located on the second adhesive layer, wherein the third adhesive layer has a second opening that expose portions of the second adhesive layer and the first adhesive layer, and the second opening is overlapped with the first opening.

In some embodiments, the supporting structure is a supporting structure formed by screen printing using ink. The screen printing includes the following steps. Providing a dot grid structure on a printed object, wherein the dot grid structure shields a portion of the printed object and exposes another portion of the printed object. Performing screen printing so that the ink is printed on another portion of the printed object through the dot grid structure. Performing vibration to make the ink slightly creep towards flattening, and the surface ink is partially dissolved with a solvent to improve the flatness, and a drying step is performed to form the supporting structure.

In some embodiments, the dot grid structure includes a plurality of shielding parts, and when the shielding parts are arranged to be closer to the center of the dot grid structure, widths of the shielding parts will change from large to small, and spacings of the shielding parts will change from small to large, and the supporting structure is formed to include the convex surface.

In some embodiments, the dot grid structure includes a plurality of shielding parts, and when the shielding parts are arranged to be closer to the center of the dot grid structure, widths of the shielding parts will change from small to large, and spacings of the shielding parts will change from large to small, and the supporting structure is formed to include the concave surface.

A silicon carbide wafer fabricated by the above-mentioned method according to some embodiments of the present disclosure is further provided, wherein a curvature of the silicon carbide wafer is within a range of ±25 μm.

Based on the above, when performing grinding using a supporting structure with a concave or convex surface on the grinding stage, by utilizing a predetermined external bending deformation of the wafer for buffering or offsetting the influence of internal residual stress of the wafer on the curvature of the wafer, a silicon carbide wafer having a flat appearance may be achieved.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 4A:
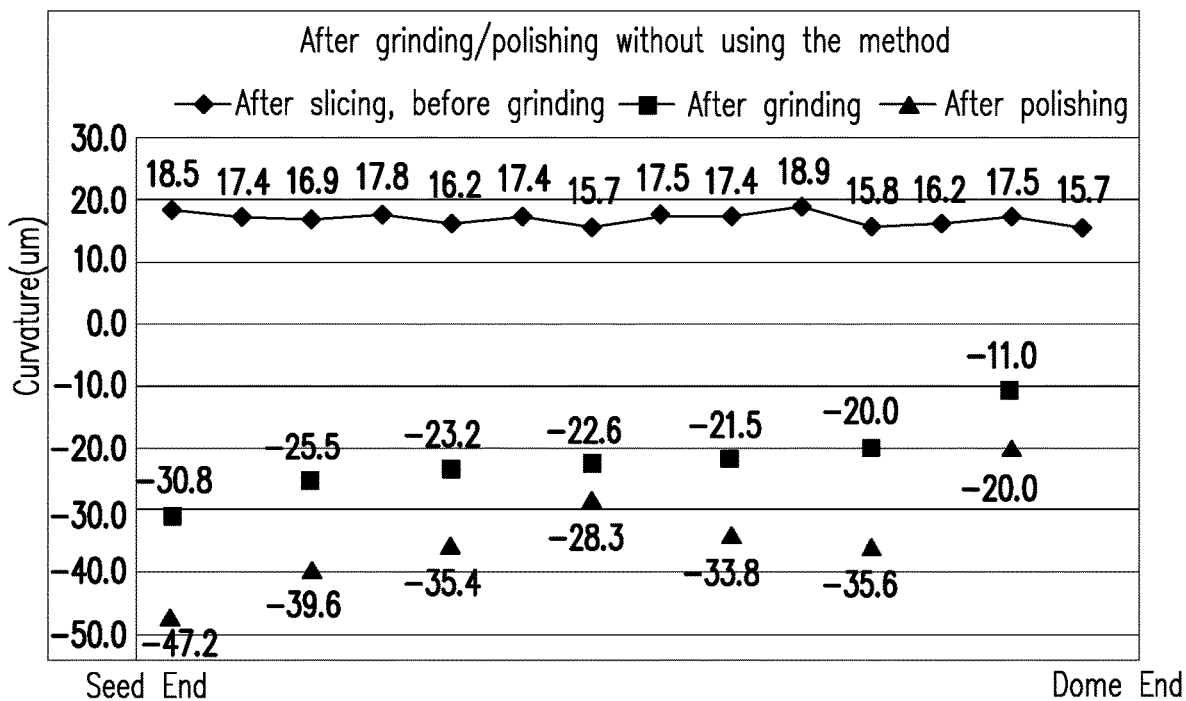
FIG. 4A is a comparative diagram of a curvature of the wafer obtained by slicing the ingot, and the continuous change of the curvature of the wafer in the subsequent grinding polishing processes without using the method of the present invention according to some comparative examples of the present disclosure.

FIG. 4A shows 14 wafers obtained by slicing a certain ingot according to some comparative examples of the present disclosure, wherein from the dome end to the seed end, there are a total of 7 wafers arranged in the even sequence, in which conventional grinding and polishing is further performed, and a comparative diagram showing the continuous curvature change is obtained. Referring to the comparative diagram of FIG. 4A, it is noted that the wafer 108W that has just been sliced still has a great thickness and is high in residual stress. By using the wire slicing technique, the wafer 108W close to the dome end 108A or the wafer 108W close to the seed end 108B all have substantially the same curvature (15.7 μm to 18.5 μm). After the conventional grinding and polishing process, due to the reduced rigidity of the wafer, and bowing and/or warping due to partial release of stress, the wafer 108W near the seed end 108B will have a greater curvature (−30.8 μm after grinding; −47.2 μm after polishing), while the wafer 108W near the dome end 108A will have less curvature (−11.0 μm after grinding; −20.0 μm after polishing).

Figure 4B:
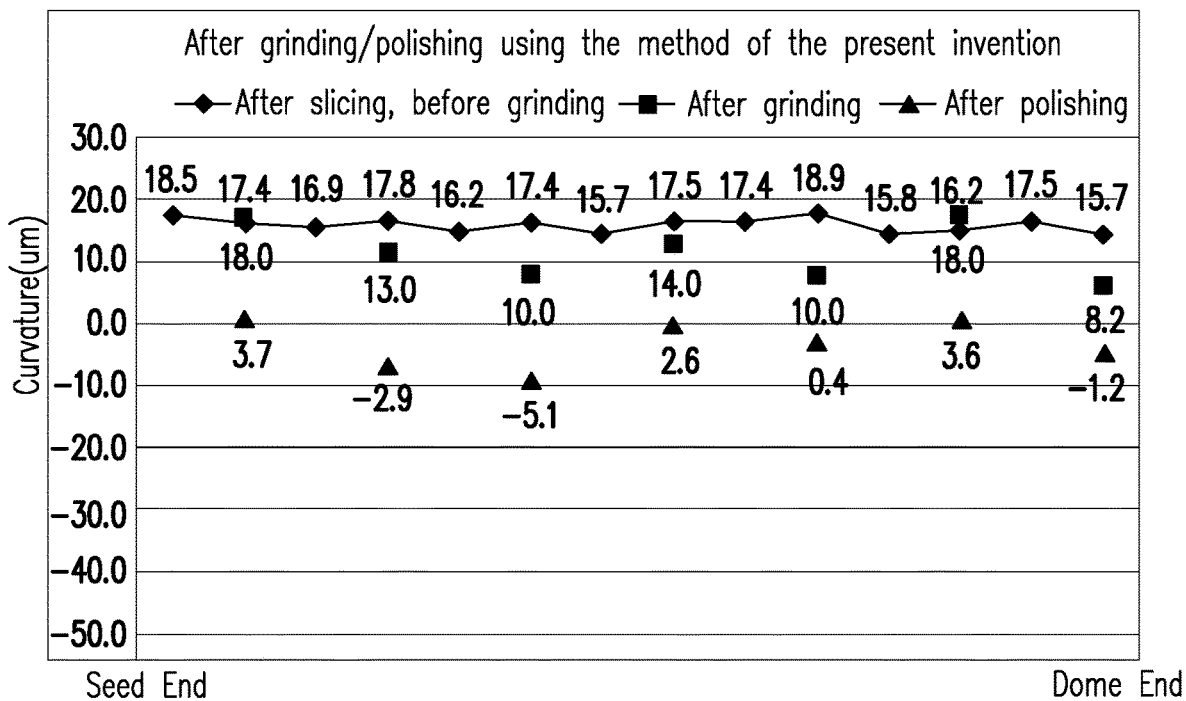
FIG. 4B is a comparative diagram of a curvature of the wafer obtained by slicing the ingot, and the continuous change of the curvature of the wafer in the subsequent grinding polishing processes using the method of the present invention according to some examples of the present disclosure.

FIG. 4B shows 14 wafers obtained by slicing the same previous ingot according to some examples of the present disclosure, wherein from the dome end to the seed end, there are a total of 7 wafers arranged in the odd sequence, in which a grinding and polishing method of the present invention is further performed, and a comparative diagram showing the continuous curvature change is obtained. As illustrated in FIG. 4B, after grinding and polishing the wafer 108W by the wafer grinding method of the present invention, the curvature of the wafer 108W at the dome end 108A and the wafer 108W near the seed end 108B can be controlled within the range of ±25 μm. This is because a predetermined external bending deformation of the wafer is used in advance for buffering or offsetting the influence of the residual stress inside the wafer on the curvature of the wafer, thereby achieving a flat appearance. Next, the wafer grinding methods according to some embodiments of the present disclosure will be described in more detail.

FIG. 5A to FIG. 5H illustrate a grinding method of a silicon carbide wafer according to some embodiments of the present disclosure.

Figure 1:
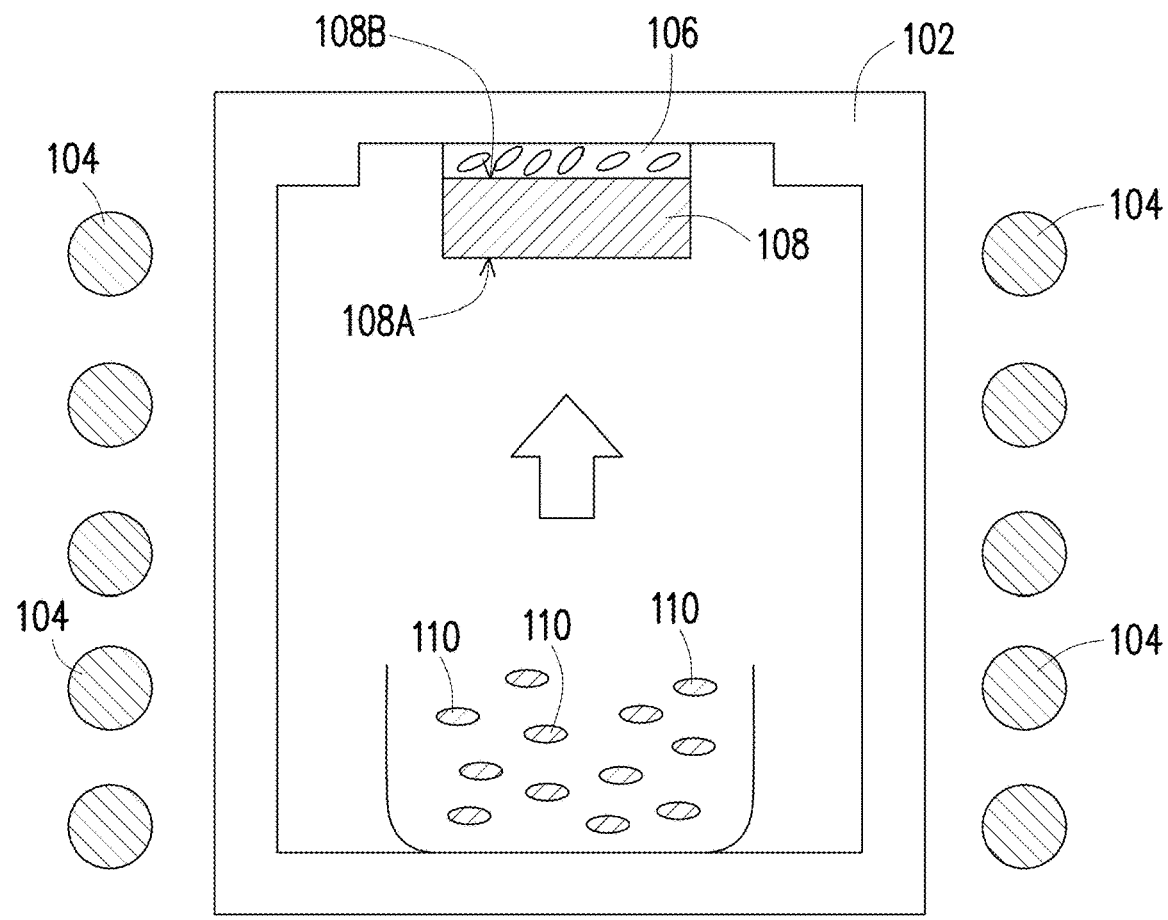
FIG. 1 is a schematic diagram of a conventional crystal growth apparatus.
Figure 2A:
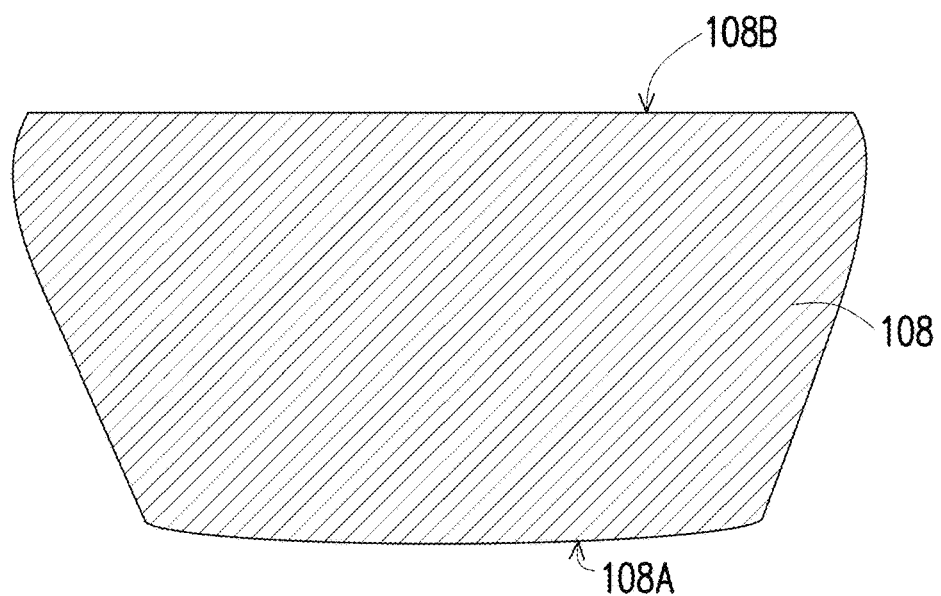
FIG. 2A and FIG. 2B are schematic cross-sectional views illustrating an ingot obtained through a crystal growth process and a slicing process of the ingot according to some embodiments of the present disclosure.
Figure 2B:
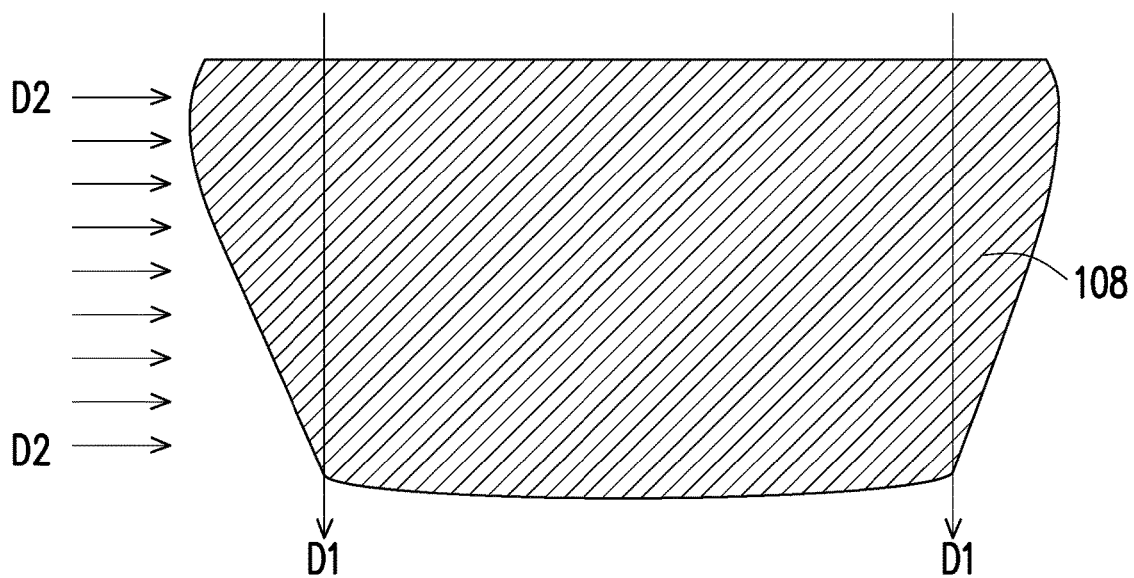
Figure 3A:
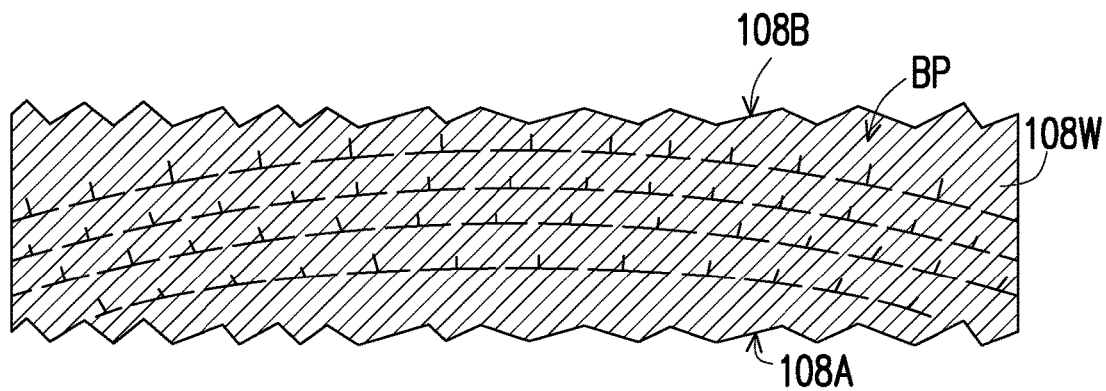
FIG. 3A and FIG. 3B are schematic diagrams of cross-sectional view changes of the wafers after slicing and before grinding, and after grinding, according to some embodiments of the present disclosure. After slicing, and before grinding and thinning (FIG. 3A) and after thinning (FIG. 3B) it shows that the appearance of the wafer tends to be warped, but the basal plane BP surface inside the wafer tends to become flat.
Figure 3B:
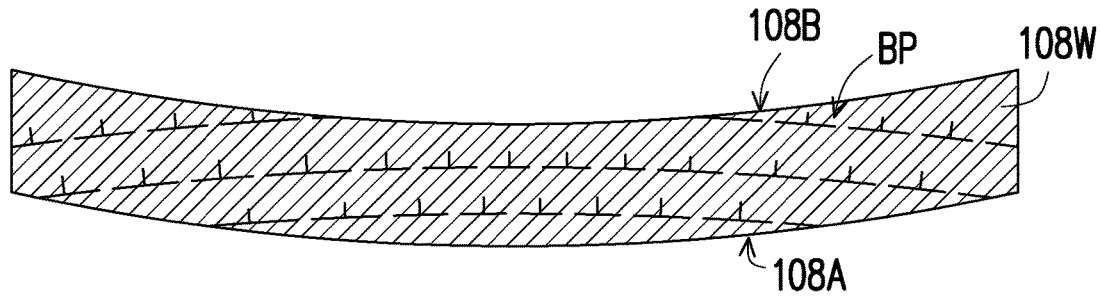
Figure 5A:
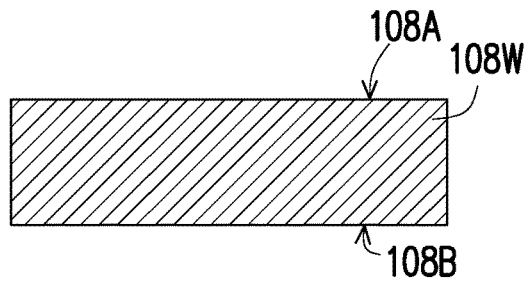
FIG. 5A to FIG. 5H illustrate a grinding method of a silicon carbide wafer according to some embodiments of the present disclosure.

Referring to FIG. 5A, a silicon carbide wafer 108W is provided. The silicon carbide wafer 108W is a silicon carbide wafer 108W obtained by slicing an ingot 108 having gone through the crystal growth process shown in FIG. 1, or having gone through other conventional processes for forming the ingot 108. In the embodiment of the present disclosure, the second surface 108A is a carbon-side surface with residual tensile stress, and the first surface 108B is a silicon-side surface with residual compressive stress, but the disclosure is not limited thereto. In some other embodiments, according to different processing conditions, the second surface 108A can also be a silicon-side surface with residual tensile stress, and the first surface 108B can also be a carbon-side surface with residual compressive stress.

Subsequently, referring to FIG. 5B, the silicon carbide wafer 108W is attached on the grinding stage 202 for performing a grinding process. In some embodiments, a supporting structure 204 having a convex surface is interposed between the grinding stage 202 and the silicon carbide wafer 108W. The convex surface of the supporting structure 204 has a convex height 204H of 20 μm to 60 μm. In some embodiments, the convex height 204H of the supporting structure 204 can be adjusted according to the curvature of the wafer obtained by performing a conventional grinding and polishing process on the wafer. The convex arrangement of the supporting structure 204 is expected to offset the curvature of the wafers arranged in different sequences. For example, referring to the diagram of FIG. 4A, the wafer near the seed end has a curvature of about −47 μm after a conventional grinding and polishing process (after partial stress release). Thus, in some embodiments, the convex height 204H of the supporting structure 204 may be set to approximately 47 μm in anticipation for offsetting the curvature of such wafers.

Figure 5B:
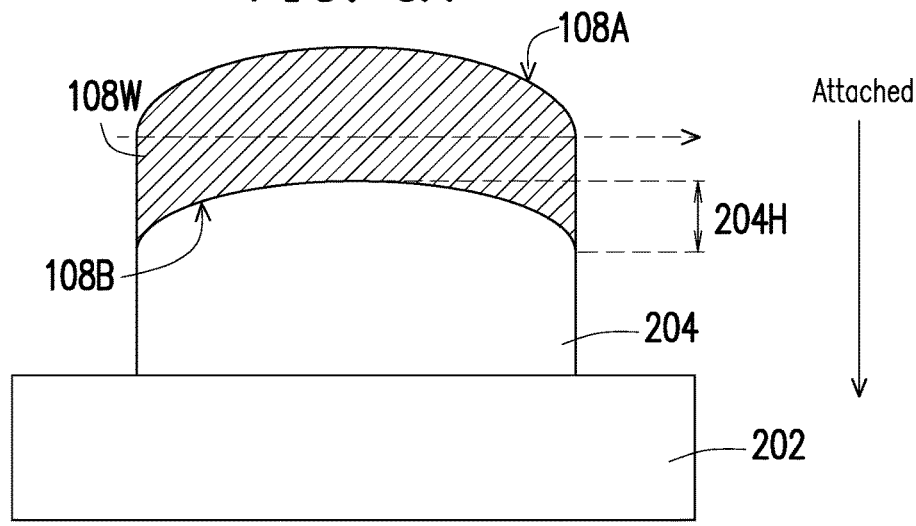
Figure 5C:
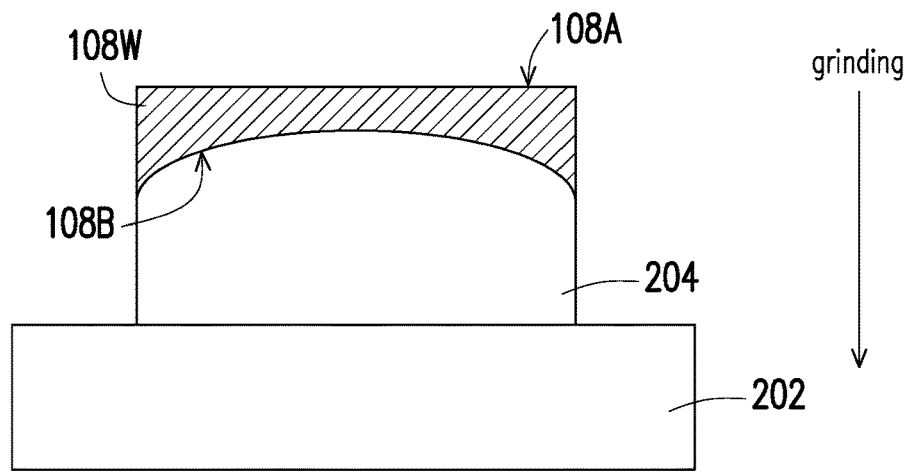

As shown in FIG. 5B, during the grinding process, the silicon carbide wafer 108W is attached and placed on the convex surface of the supporting structure 204 so that the first surface 108B is in contact with the convex surface, and grinding is performed to remove a portion of the second surface 108A of the silicon carbide wafer 108W. In some embodiments, when the supporting structure 204 has a convex surface, the first surface 108B will exhibit a negative curvature in anticipation for offsetting this negative curvature. In some embodiments, since the silicon carbide wafer 108W is placed on the convex surface, the second surface 108A of the silicon carbide wafer 108W has a protruding portion. The protruding portion on the second surface 108A can be removed by performing a grinding process to obtain the structure shown in FIG. 5C.

Figure 5D:
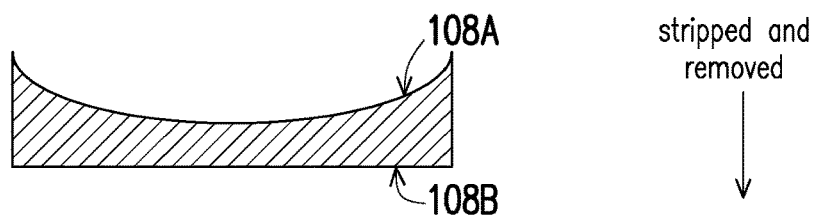
Figure 5E:
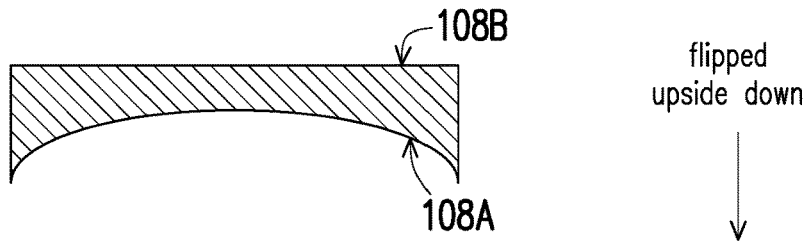
Figure 5F:
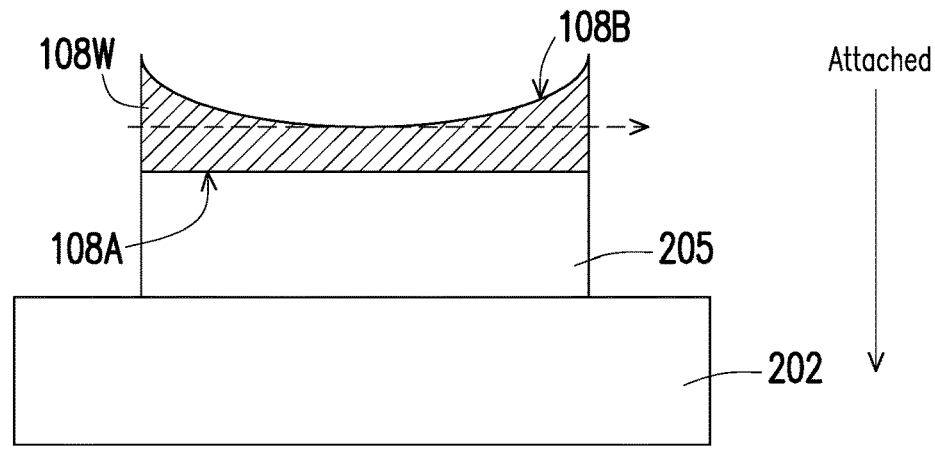
Figure 5G:
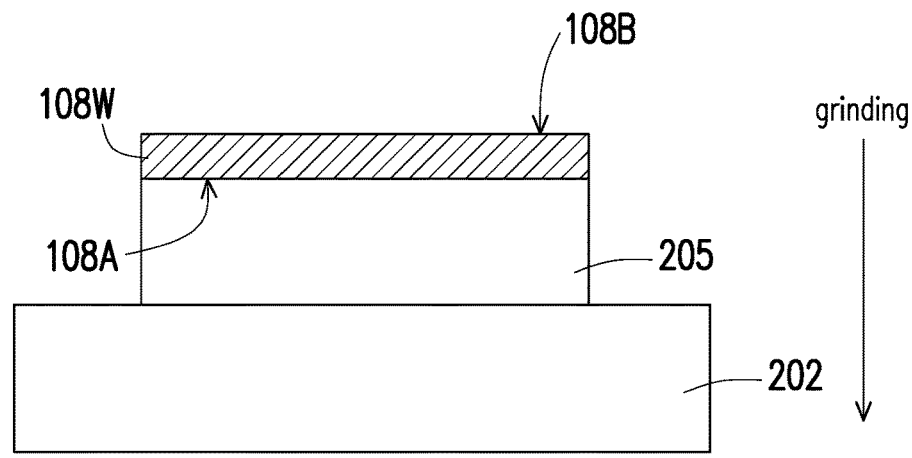

Next, referring to FIG. 5D, the supporting structure 204 is removed, and the silicon carbide wafer 108W is stripped and removed. As shown in FIG. 5D, the negative curvature of the first surface 108B is slightly offset due to the partial release of the residual stress. After the supporting structure 204 is removed, the silicon carbide wafer 108W is flipped upside down as shown in FIG. 5E, and the silicon carbide wafer 108W is attached and placed on the grinding stage 202 as shown in FIG. 5F. In some embodiments, after the supporting structure 204 is removed, the silicon carbide wafer 108W is flipped and placed on a flat surface of a second supporting structure 205 on the grinding stage 202, so that the second surface 108A is in contact with the flat surface and grinding is performed to remove portions of first surface 108B of the silicon carbide wafer 108W. In some embodiments, when the silicon carbide wafer 108W is flipped upside down and placed on the grinding stage 202, the first surface 108B of the silicon carbide wafer 108W may include protrusions or non-planar portions (e.g. at the edge). The protrusions or non-planar portions on the first surface 108B can be removed by a grinding process to obtain the structure shown in FIG. 5G.

Figure 5H:
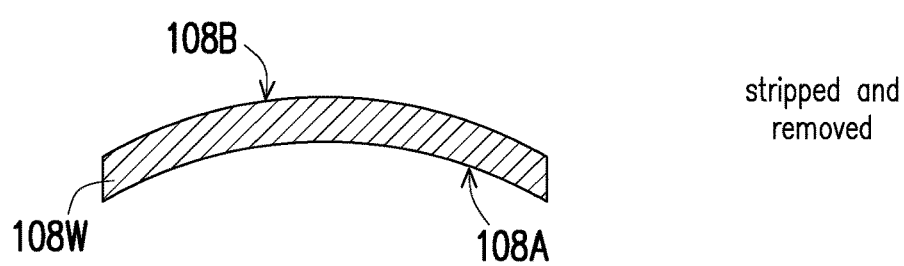

Finally, referring to FIG. 5H, after the silicon carbide wafer 108W subjected to the grinding process is removed from the grinding stage 202, the residual stress inside the silicon carbide wafer 108W will be partially released due to the reduction in the thickness of the silicon carbide wafer 108W. Subsequently, the negative curvature of the first surface 108B is offset to form a silicon carbide wafer 108W with high flatness. The curvature of the silicon carbide wafer formed by the above method can be effectively controlled within the range of ±25 μm.

FIG. 6A to FIG. 6H illustrate a grinding method of a silicon carbide wafer according to some other embodiments of the present disclosure.

Figure 6A:
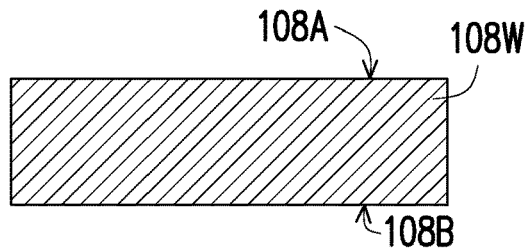
FIG. 6A to FIG. 6H illustrate a grinding method of a silicon carbide wafer according to some other embodiments of the present disclosure.

Referring to FIG. 6A, a silicon carbide wafer 108W is provided. The silicon carbide wafer 108W is a silicon carbide wafer 108W obtained by slicing an ingot 108 having gone through the crystal growth process shown in FIG. 1, or having gone through other conventional processes for forming the ingot 108. In some embodiments, the silicon carbide wafer 108W has a first surface 108B and a second surface 108A opposite the first surface 108B. In the illustrated embodiment, the first surface 108B is a surface with residual compressive stress, and the second surface 108A is a surface with residual tensile stress. In the exemplary embodiment, the first surface 108B is a silicon-side surface and the second surface 108A is a carbon-side surface, but the disclosure is not limited thereto. In some other embodiments, according to different processing conditions, the first surface 108B can also be a carbon-side surface with residual compressive stress, and the second surface 108A can also be a silicon-side surface with residual tensile stress.

Subsequently, referring to FIG. 6B, the silicon carbide wafer 108W is attached and placed on the grinding stage 202 for performing a grinding process. In some embodiments, a supporting structure 204 having a concave surface is interposed between the grinding stage 202 and the silicon carbide wafer 108W. The concave surface of the supporting structure 204 has a concave depth 204D of 20 μm to 60 μm. In some embodiments, the concave depth 204D of the supporting structure 204 can be adjusted according to the curvature of the wafer obtained by performing a conventional grinding and polishing process on the wafer. For example, in some embodiments, the wafer near the seed end has a positive curvature after a conventional grinding and polishing process (after stress release). Thus, in some embodiments, the concave depth 204D of the supporting structure 204 may be set to a depth that is expected to offset the positive curvature of such wafers.

Figure 6B:
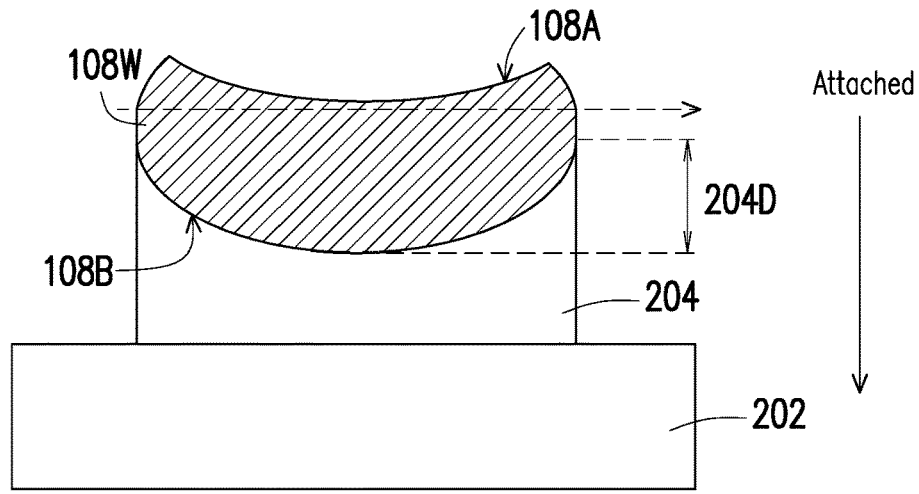
Figure 6C:
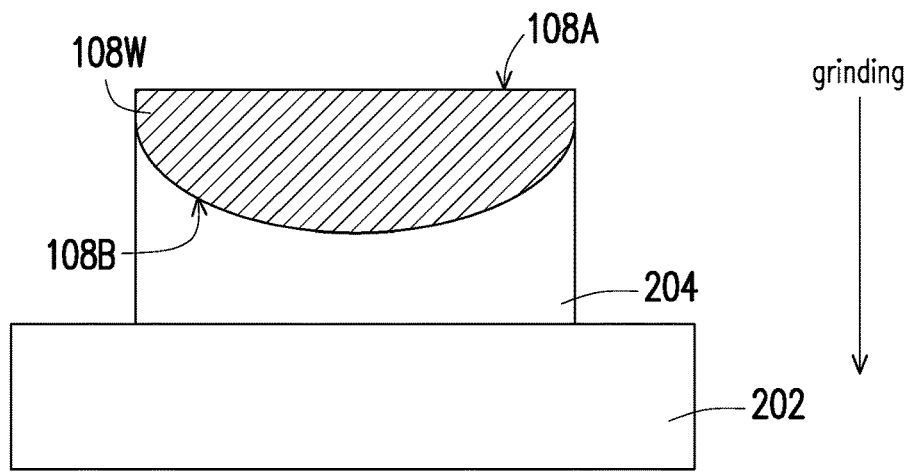

As shown in FIG. 6B, during the grinding process, the silicon carbide wafer 108W is placed on the concave surface of the supporting structure 204 so that the first surface 108B is in contact with the concave surface, and grinding is performed to remove a portion of a second surface 108A of the silicon carbide wafer 108W. In some embodiments, when the supporting structure 204 has a concave surface, the first surface 108B has a positive curvature in anticipation for offsetting this positive curvature. In some embodiments, since the silicon carbide wafer 108W is placed on the concave surface, the second surface 108A of the silicon carbide wafer 108W may have protrusions or non-planar portions (e.g. at the edge). A grinding process is performed to remove the protrusions or non-planar portions on the second surface 108A to obtain the structure shown in FIG. 6C.

Figure 6D:
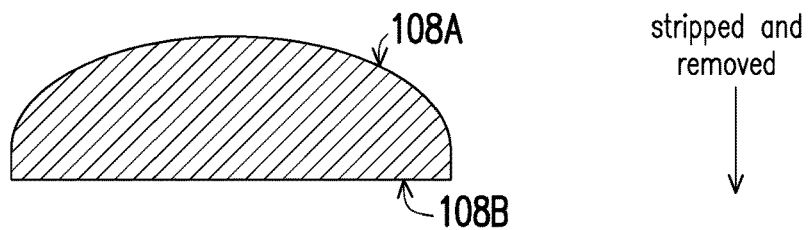
Figure 6E:
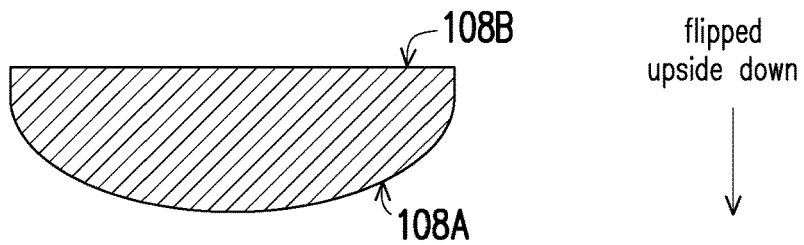
Figure 6F:
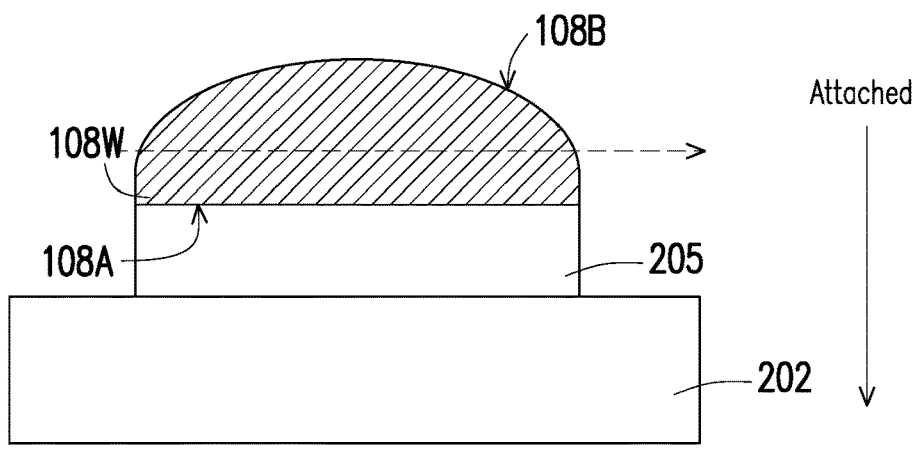
Figure 6G:
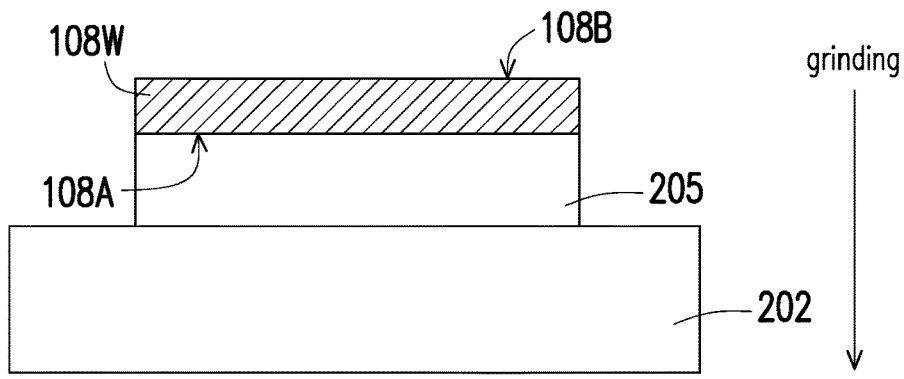

Next, referring to FIG. 6D, the supporting structure 204 is removed, and the silicon carbide wafer 108W is stripped and removed. As shown in FIG. 6D, the positive curvature of the first surface 108B is slightly offset due to the partial release of the residual stress. After the supporting structure 204 is removed, the silicon carbide wafer 108W is flipped upside down as shown in FIG. 6E, and the silicon carbide wafer 108W is attached and placed on the grinding stage 202 as shown in FIG. 6F. In some embodiments, after the supporting structure 204 is removed, the silicon carbide wafer 108W is flipped and placed on a flat surface of a second supporting structure 205 on the grinding stage 202 so that the second surface 108A is in contact with the flat surface, and grinding is performed to remove portions of the first surface 108B of the silicon carbide wafer 108W. In some embodiments, when the silicon carbide wafer 108W is flipped upside down, the first surface 108B of the silicon carbide wafer 108W may have protrusions or non-planar portions. A grinding process is performed to remove the protrusions or non-planar portions on the first surface 108B to obtain the structure shown in FIG. 6G.

Figure 6H:
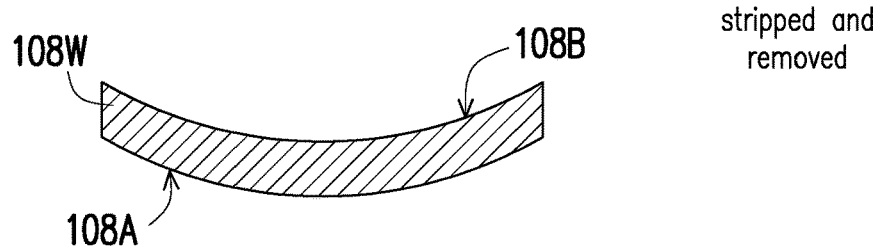

Finally, referring to FIG. 6H, after the silicon carbide wafer 108W subjected to the grinding process is removed from the grinding stage 202, the residual stress inside the silicon carbide wafer 108W will be partially released due to the reduction in the thickness of the silicon carbide wafer 108W. Subsequently, the positive curvature of the first surface 108B is offset to form the silicon carbide wafer 108W with high flatness. The curvature of the silicon carbide wafer formed by the above method can be effectively controlled within the range of ±25 μm.

Next, the supporting structure 204 having either a concave surface or a convex surface used in FIG. 5A to FIG. 5H and FIG. 6A to FIG. 6H will be described.

Figure 7A:
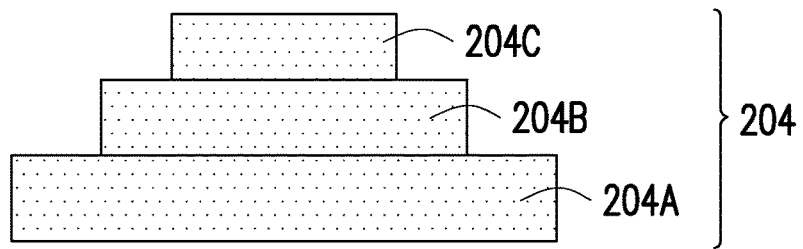
FIG. 7A and FIG. 7B are a cross-sectional view and an exploded top view of a supporting structure according to some embodiments of the present disclosure.
Figure 7B:
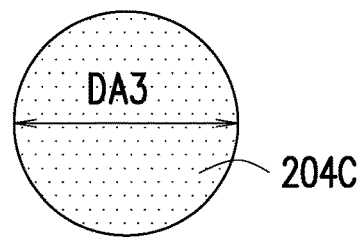
Figure 7B:
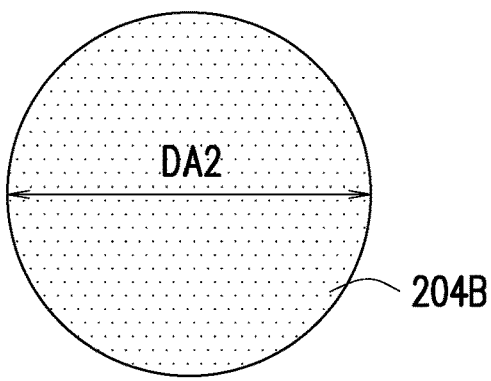
Figure 7B:
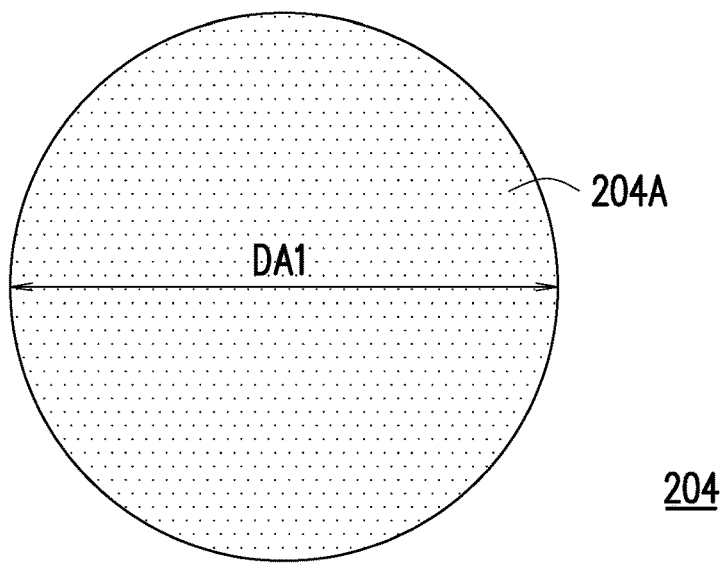

FIG. 7A is a cross-sectional view of a supporting structure 204 having a convex surface in accordance with some embodiments of the present disclosure. FIG. 7B is an exploded top view of the supporting structure 204 according to FIG. 7A. Referring to FIG. 7A and FIG. 7B, in some embodiments, the supporting structure 204 is an adhesive tape including a convex surface, and the adhesive tape includes a first adhesive layer 204A, a second adhesive layer 204B and a third adhesive layer 204C. The first adhesive layer 204A has a first diameter DA1. The second adhesive layer 204B is located on the first adhesive layer 204A and has a second diameter DA2. The third adhesive layer 204C is located on the second adhesive layer 204B and has a third diameter DA3, wherein DA1>DA2>DA3.

In the embodiments of the present disclosure, although an adhesive tape having three layers of adhesive layers is used to form the supporting structure 204 having the convex surface, the present disclosure is not limited thereto. In some other embodiments, the supporting structure 204 may also include one layer or more than three layers of adhesive tapes to form the supporting structure 204 having a convex surface, and the supporting structure 204 may also be made of materials other than the adhesive tape. In other words, the material of the supporting structure 204 having the convex surface is not particularly limited, as long as the material of the supporting structure 204 with the convex surface fulfill the arrangement of having a convex height of 20 μm to 60 μm.

Figure 8A:
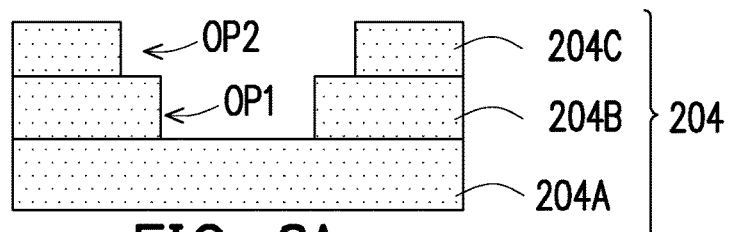
FIG. 8A and FIG. 8B are a cross-sectional view and an exploded top view of a supporting structure according to some other embodiments of the present disclosure.
Figure 8B:
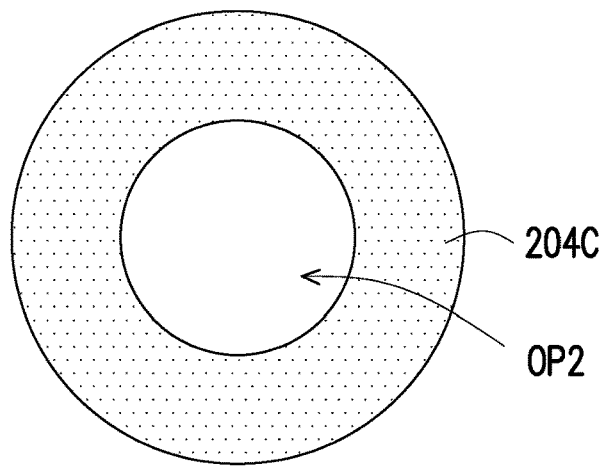
Figure 8B:
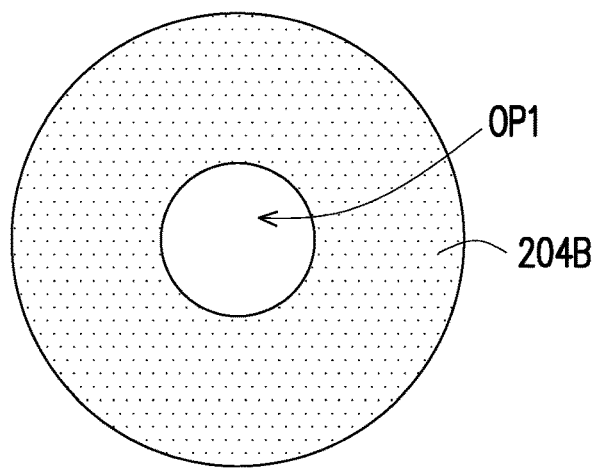
Figure 8B:
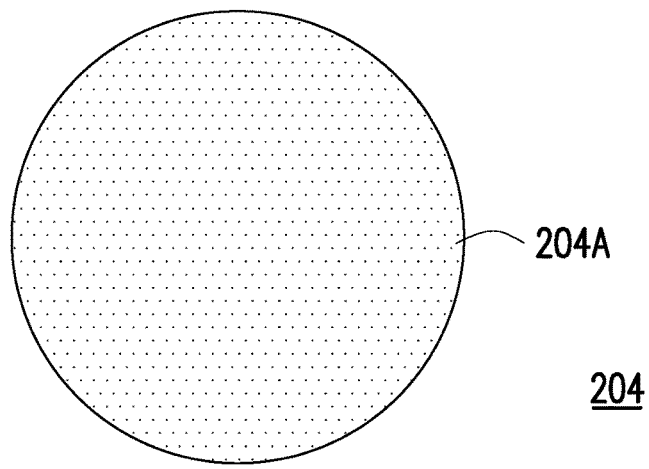

FIG. 8A is a cross-sectional view of a supporting structure 204 having a concave surface in accordance with some embodiments of the present disclosure. FIG. 8B is an exploded top view of the supporting structure 204 according to FIG. 8A. Referring to FIG. 8A and FIG. 8B, in some embodiments, the supporting structure 204 is an adhesive tape including a concave surface, and the adhesive tape includes a first adhesive layer 204A, a second adhesive layer 204B and a third adhesive layer 204C. The second adhesive layer 204B is located on the first adhesive layer 204A, wherein the second adhesive layer 204B has a first opening OP1 that expose a portion of the first adhesive layer 204A. The third adhesive layer 204C is located on the second adhesive layer 204B, wherein the third adhesive layer 204C has a second opening OP2 that expose portions of the second adhesive layer 204B and the first adhesive layer 204A. In addition, the second opening OP2 is overlapped with the first opening OP1.

In the embodiments of the present disclosure, although the supporting structure 204 having the concave surface is constituted by an adhesive tape having three layers of adhesive layers, the present disclosure is not limited thereto. In other embodiments, the supporting structure 204 may also include one layer or more than three layers of adhesive tapes to form the supporting structure 204 having a concave surface, and the supporting structure 204 may also be made of materials other than the adhesive tape. In other words, the material of the supporting structure 204 having the concave surface is not particularly limited, as long as the material of the supporting structure 204 with the concave surface fulfill the arrangement of having a concave depth of 20 μm to 60 μm.

In some embodiments, the supporting structure 204 may also be a supporting structure 204 formed by screen printing using ink. The screen printing steps will be described with reference to FIG. 9.

Figure 9:
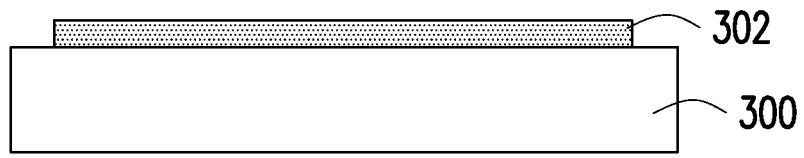
FIG. 9 is a schematic cross-sectional view of a stage of a screen printing process according to some embodiments of the present disclosure

FIG. 9 is a schematic cross-sectional view of a stage of a screen printing process according to some embodiments of the present disclosure. As shown in FIG. 9, in some embodiments, a dot grid structure 302 is provided on a printed object 300, wherein the dot grid structure 302 shields a portion of the printed object 300 and exposes another portion of the printed object 300. The printed object 300 can be any substrate or stage used for carrying ink, but the present disclosure is not limited thereto. During screen printing, the ink is printed on another portion (i.e., the unmasked part) of the printed object 300 through the dot grid structure 302. After the dot grid structure 302 is removed, the ink is vibrated to make the ink slightly creep, and the ink tends to become flattened under microscopic observation. The surface ink is partially dissolved with a little solvent to make the ink even flatter under microscopic observation, whereby the ink is finally dried and cured, and a supporting structure 204 having a concave or convex surface under macroscopic view is formed.

In some embodiments, forming the supporting structure 204 with a concave or convex surface can be achieved by adjusting the design of the dot grid structure 302. Next, the design of the dot grid structure 302 will be described.

Figure 10A:
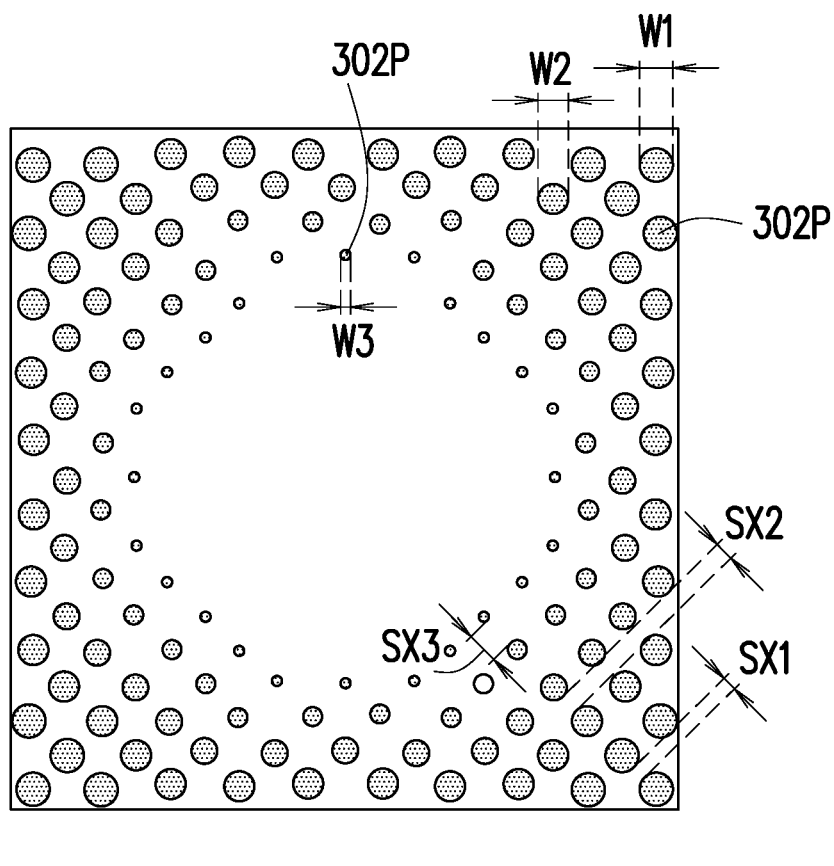
FIG. 10A to FIG. 10D are top views of dot grid structures according to some embodiments of the present disclosure.

FIG. 10A to FIG. 10D are top views of dot grid structures according to some embodiments of the present disclosure. Referring to FIG. 10A, in some embodiments, the dot grid structure 302 includes a plurality of shielding parts 302P. As the shielding parts 302P are arranged to be closer to the center of the dot grid structure 302, their widths will change from large to small (for example, from the maximum width of W1 to the reduced width of W2, and then to the further reduced width of W3), and the spacing will be change from small to large (for example, spacing SX1, spacing SX2, and spacing SX3 will change from small to large). Accordingly, when screen printing is performed through a dot grid structure 302 having such design, the resulting supporting structure 204 will include the convex surface.

Figure 10B:
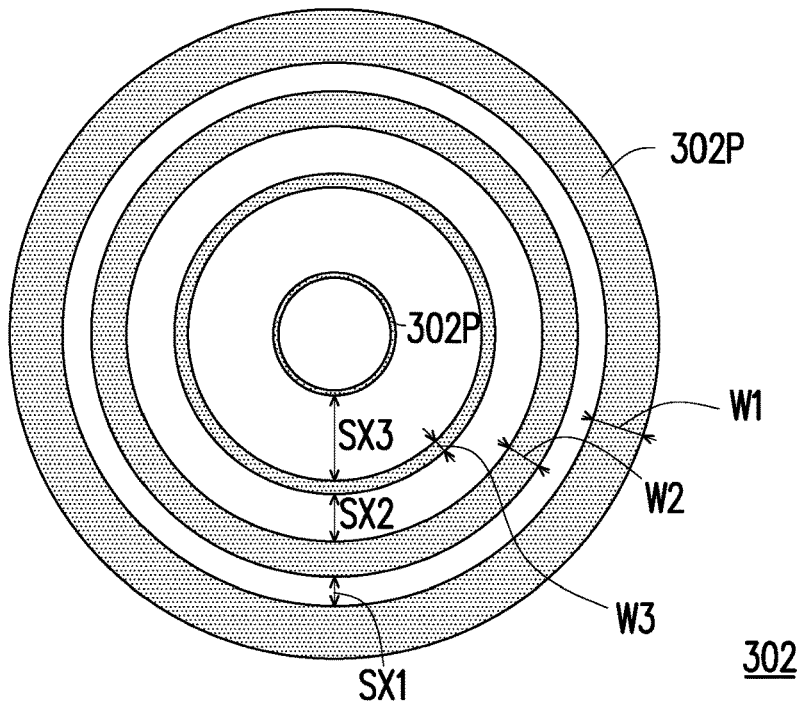

In the embodiment of FIG. 10A, the shielding parts of the dot grid structure 302 are designed in the form of a scattered dot structure, but the present disclosure is not limited thereto. Referring to FIG. 10B, the shielding parts 302P of the dot grid structure 302 are designed with a continuous arc-shaped structure. As shown in FIG. 10B, when the shielding parts 302P are arranged to be closer to the center of the dot grid structure 302, their widths will change from large to small (W1>W2>W3), and their spacing will change from small to large (SX1<SX2<SX3). Accordingly, when screen printing is performed through a dot grid structure 302 having such design, the resulting supporting structure 204 will include the convex surface.

The dot grid structure 302 of FIG. 10A and FIG. 10B can be used to form the supporting structure 204 having a convex surface. Next, the formation of the supporting structure 204 having the concave surface will be described.

Figure 10C:
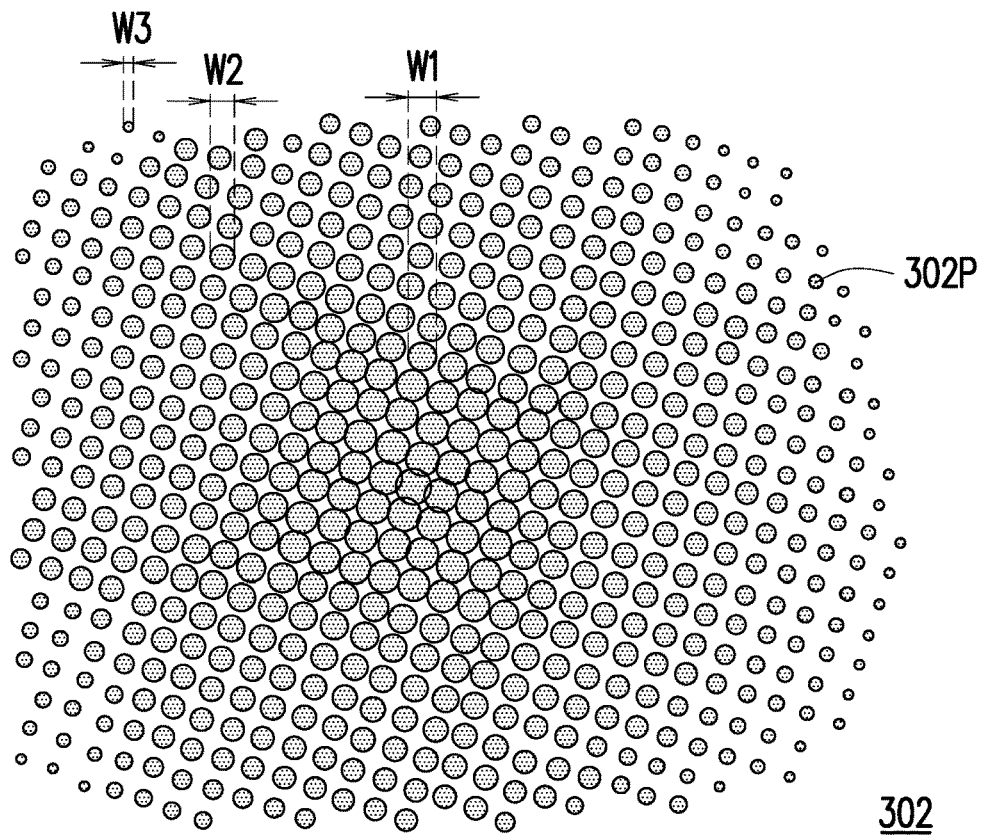

Referring to FIG. 10C, in some embodiments, the dot grid structure 302 includes a plurality of shielding parts 302P. As the shielding parts 302P are arranged to be closer to the center of the dot grid structure 302, their widths will change from small to large (for example, from the minimum width W3 to the increased width W2, and then to the further increased width W1), and their spacing will change from large to small (the closer to the center, the higher the density of the shielded portion 302P). Accordingly, when screen printing is performed through a dot grid structure 302 having such design, the resulting supporting structure 204 will include the concave surface.

Figure 10D:
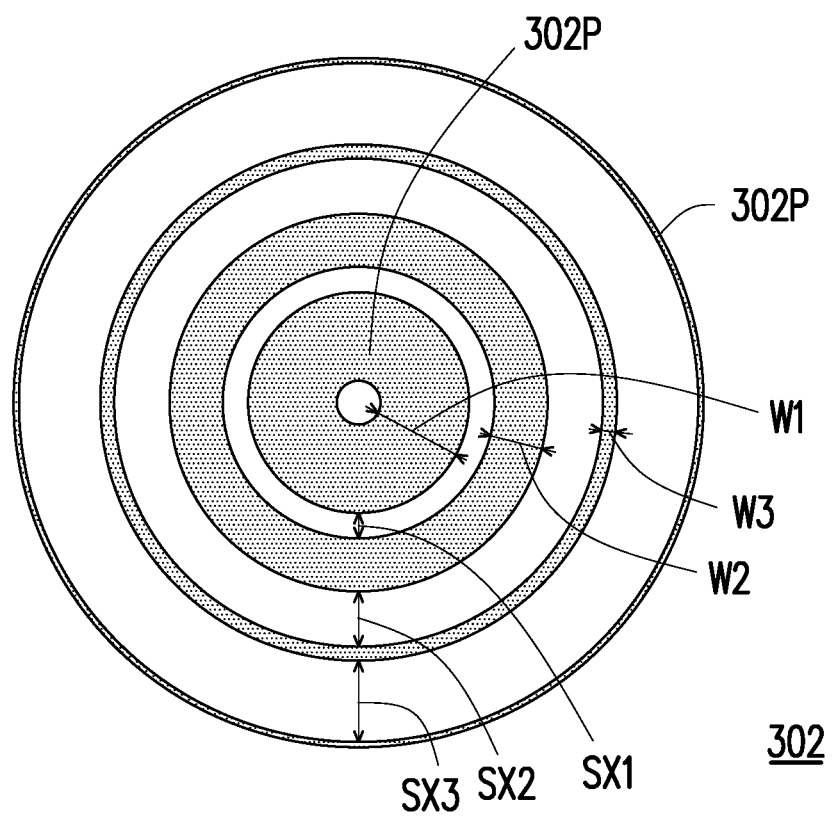

In the embodiment of FIG. 10C, the shielding parts of the dot grid structure 302 are designed in the form of a scattered dot structure, but the present disclosure is not limited thereto. Referring to FIG. 10D, the shielding parts 302P of the dot grid structure 302 are designed with a continuous arc-shaped structure. As shown in FIG. 10D, when the shielding part 302P are arranged to be closer to the center of the dot grid structure 302, their width will change from small to large (W3<W2<W1), and their spacing will change from large to small (SX3>SX2>SX1). Accordingly, when screen printing is performed through a dot grid structure 302 having such design, the resulting supporting structure 204 will include the concave surface.

In summary, in the grinding method of silicon carbide wafers of the present disclosure, when a supporting structure having a concave surface or a convex surface is disposed on the grinding stage for grinding, the ground wafer can offset the bending deformation of the wafer through stress release, thus reducing the influence of the internal stress release of the wafer on its curvature. Accordingly, a silicon carbide wafer with ideal flatness can be achieved.

What is claimed is:

1. A grinding method of silicon carbide wafers, comprising:
slicing an ingot obtained from a crystal growth process to obtain a silicon carbide wafer, wherein the silicon carbide wafer has a first surface and a second surface opposite to the first surface;
pre-forming a supporting structure having a concave surface or a convex surface, and placing the supporting structure on a grinding stage;
after forming the supporting structure, placing the silicon carbide wafer on a grinding stage over the supporting structure for performing a grinding process, wherein the supporting structure is interposed between the grinding stage and the silicon carbide wafer, and the grinding process comprises:
placing the silicon carbide wafer on the concave surface or the convex surface of the supporting structure, so that a non-grinding surface in a first grinding step of the silicon carbide wafer contacts the concave surface or the convex surface, wherein the non-grinding surface is the first surface, and performing the first grinding step to remove portions of the second surface of the silicon carbide wafer; and
removing the supporting structure, flipping the silicon carbide wafer and placing the silicon carbide wafer on the grinding stage, and performing a second grinding step to remove portions of the first surface of the silicon carbide wafer.

2. The method according to claim 1, wherein the concave surface of the supporting structure has a concave depth of 20 μm to 60 μm, or the convex surface of the supporting structure has a convex height of 20 μm to 60 μm.

3. The method according to claim 1, wherein, when the supporting structure has the convex surface, the first surface has residual compressive stress and the second surface has residual tensile stress, and when the supporting structure has the concave surface, the first surface has residual tensile stress and the second surface has residual compressive stress.

4. The method according to claim 1, wherein, when the supporting structure has the concave surface, the first surface has a negative curvature, and when the supporting structure has the convex surface, the first surface has a positive curvature.

5. The method according to claim 1, wherein after removing the supporting structure, the silicon carbide wafer is flipped and placed on a flat surface of a second supporting structure on the grinding stage so that a non-grinding surface in the second grinding step of the silicon carbide wafer is in contact with the flat surface, wherein the non-grinding surface in the second grinding step is the second surface, and the second grinding step is performed to remove the portions of the first surface of the silicon carbide wafer.

6. The method according to claim 1, wherein the supporting structure is an adhesive tape including the concave surface, and the adhesive tape comprises:
a first adhesive layer;
a second adhesive layer located on the first adhesive layer, wherein the second adhesive layer has a first opening exposing a portion of the first adhesive layer; and
a third adhesive layer located on the second adhesive layer, wherein the third adhesive layer has a second opening exposing portions of the second adhesive layer and the first adhesive layer, and the second opening is overlapped with the first opening.

7. The method according to claim 1, wherein the supporting structure is an adhesive tape including the convex surface, and the adhesive tape comprises:
a first adhesive layer having a first diameter DA1;
a second adhesive layer located on the first adhesive layer, and having a second diameter DA2; and
a third adhesive layer located on the second adhesive layer, and having a third diameter DA3, wherein DA1>DA2>DA3.

8. The method according to claim 1, wherein the supporting structure is a supporting structure formed by screen printing using ink, and the screen printing process comprises:
providing a dot grid structure on a printed object, wherein the dot grid structure shields a portion of the printed object and exposes another portion of the printed object;
performing screen printing so that the ink is printed on the another portion of the printed object through the dot grid structure; and
performing vibrating and drying steps for forming the supporting structure.

9. The method according to claim 8, wherein the dot grid structure comprises a plurality of shielding parts, and as the plurality of shielding parts are arranged to be closer to the center of the dot grid structure, widths of the plurality of shielding parts will change from large to small, and spacings of the plurality of shielding parts will change from small to large, and the supporting structure is formed to include the convex surface.

10. The method according to claim 8, wherein the dot grid structure comprises a plurality of shielding parts, and as the plurality of shielding parts are arranged to be closer to the center of the dot grid structure, widths of the plurality of shielding parts will change from small to large, and spacings of the plurality of shielding parts will change from large to small, and the supporting structure is formed to include the concave surface.

11. A silicon carbide wafer fabricated by the method according to claim 1, wherein a curvature of the silicon carbide wafer is within a range of ±25 μm.

12. A grinding method of silicon carbide wafers, comprising:
slicing an ingot obtained from a crystal growth process to obtain a silicon carbide wafer, wherein the silicon carbide wafer has a first surface and a second surface opposite to the first surface;
performing a grinding and polishing process on the silicon carbide wafer, and measuring a curvature of the silicon carbide wafer after the grinding and polishing process;
placing the silicon carbide wafer on a grinding stage for performing a grinding process, wherein a supporting structure having a concave surface or a convex surface is interposed between the grinding stage and the silicon carbide wafer, and wherein a concave depth of the concave surface or a convex height of the convex surface is set according to the curvature of the silicon carbide wafer, and the concave surface of the supporting structure has a concave depth of 20 μm to 60 μm, or the convex surface of the supporting structure has a convex height of 20 μm to 60 μm, and the grinding process comprises:
placing the silicon carbide wafer on the concave surface or the convex surface of the supporting structure, so that the first surface contacts the concave surface or the convex surface, and performing grinding to remove portions of the second surface of the silicon carbide wafer; and removing the supporting structure, flipping the silicon carbide wafer and placing the silicon carbide wafer on the grinding stage, and performing grinding to remove portions of the first surface of the silicon carbide wafer.

\* \* \* \* \*